（12） United States Patent
Yamakawa

(10) Patent No.: US 8,847,646 B2
(45) Date of Patent: Sep. 30, 2014

(54) SEMICONDUCTOR INTEGRATED CIRCUIT

(71) Applicant: Kabushiki Kaisha Toshiba, Minato-Ku (JP)

(72) Inventor: Yasushi Yamakawa, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/963,259

(22) Filed: Aug. 9, 2013

(65) Prior Publication Data

US 2014/0240014 A1    Aug. 28, 2014

Related U.S. Application Data

(60) Provisional application No. 61/769,947, filed on Feb. 27, 2013.

(51) Int. Cl.
*H03L 7/00* (2006.01)
*H03K 5/00* (2006.01)

(52) U.S. Cl.
CPC ........................................ *H03K 5/00* (2013.01)
USPC ............................ 327/160; 327/151; 327/261

(58) Field of Classification Search
USPC .......................................... 327/151, 160, 261
See application file for complete search history.

(56) References Cited

U.S. PATENT DOCUMENTS

| 7,911,252 | B2 * | 3/2011 | Kondou ......................... 327/291 |
| 7,975,082 | B2 * | 7/2011 | Chiu et al. ....................... 710/52 |
| 8,466,700 | B2 * | 6/2013 | Motz et al. ............... 324/750.07 |
| 8,649,204 | B2 * | 2/2014 | Park et al. ...................... 365/148 |
| 8,677,172 | B2 * | 3/2014 | Anderson et al. ............. 713/500 |
| 2008/0205170 | A1 | 8/2008 | Ikeda |

FOREIGN PATENT DOCUMENTS

| JP | 2000-285700 | 10/2000 |
| JP | 2008-151719 | 7/2008 |
| JP | 2008-210487 | 9/2008 |

* cited by examiner

*Primary Examiner* — Adam Houston
(74) *Attorney, Agent, or Firm* — Oblon, Spivak, McClelland, Maier & Neustadt, L.L.P.

(57) ABSTRACT

In a system in which the phases of a data clock signal and a data signal differ between at an input and at an output, a semiconductor integrated circuit performs a simple BER test without using external equipment and, at the same time, performs a jitter evaluation required for a margin evaluation.

16 Claims, 4 Drawing Sheets

SEMICONDUCTOR INTEGRATED CIRCUIT

CROSS-REFERENCE TO RELATED APPLICATION

This application is based upon and claims the benefit of U.S. provisional Application No. 61/769,947, filed on Feb. 27, 2013, the entire contents of which are incorporated herein by reference.

FIELD

Embodiments described herein relate generally to a semiconductor integrated circuit.

BACKGROUND

There is a semiconductor integrated circuit to which a double data rate (DDR) scheme or the like, in which the phase difference between a data clock signal and a data signal differs between at an output and at an input, is applied.

DETAILED DESCRIPTION

A semiconductor integrated circuit according to an embodiment having a first terminal, a second terminal, a third terminal and a fourth terminal. The semiconductor integrated circuit includes a first data clock adjusting circuit that outputs a first clock signal to an outside of the semiconductor integrated circuit via the first terminal. The semiconductor integrated circuit includes a first phase controlling circuit that is capable of controlling a phase of the first clock signal output from the first data clock adjusting circuit and superposing a jitter on the first clock signal. The semiconductor integrated circuit includes a second data clock adjusting circuit that receives the first clock signal from the outside of the semiconductor integrated circuit via the second terminal and outputs a second clock signal a second phase controlling circuit that controls a phase of the second clock signal output from the second data clock adjusting circuit. The semiconductor integrated circuit includes a data generating circuit that generates a test data signal in a test operation. The semiconductor integrated circuit includes a first data input/output circuit that outputs the test data signal to the outside of the semiconductor integrated circuit via the third terminal in synchronization with the first clock signal in the test operation. The semiconductor integrated circuit includes a second data input/output circuit that strobes the test data signal input thereto from the outside of the semiconductor integrated circuit via the fourth terminal in synchronization with the second clock signal in the test operation. The semiconductor integrated circuit includes a cycle adjusting circuit that is capable of, in the test operation, latching the test data signal generated by the data generating circuit and adjusting a cycle in which the latched test data signal is output. The semiconductor integrated circuit includes a data comparing circuit that compares data of the test data signal output from the cycle adjusting circuit and data of the test data signal strobed by the second data input/output circuit and detects an error bit. The semiconductor integrated circuit includes a counter that counts the number of error bits detected by the data comparing circuit. The semiconductor integrated circuit includes a result outputting circuit that outputs an analysis result based on the number of the error bits counted by the counter.

In the following, embodiments will be described with reference to the drawings.

First Embodiment

Figure 1:
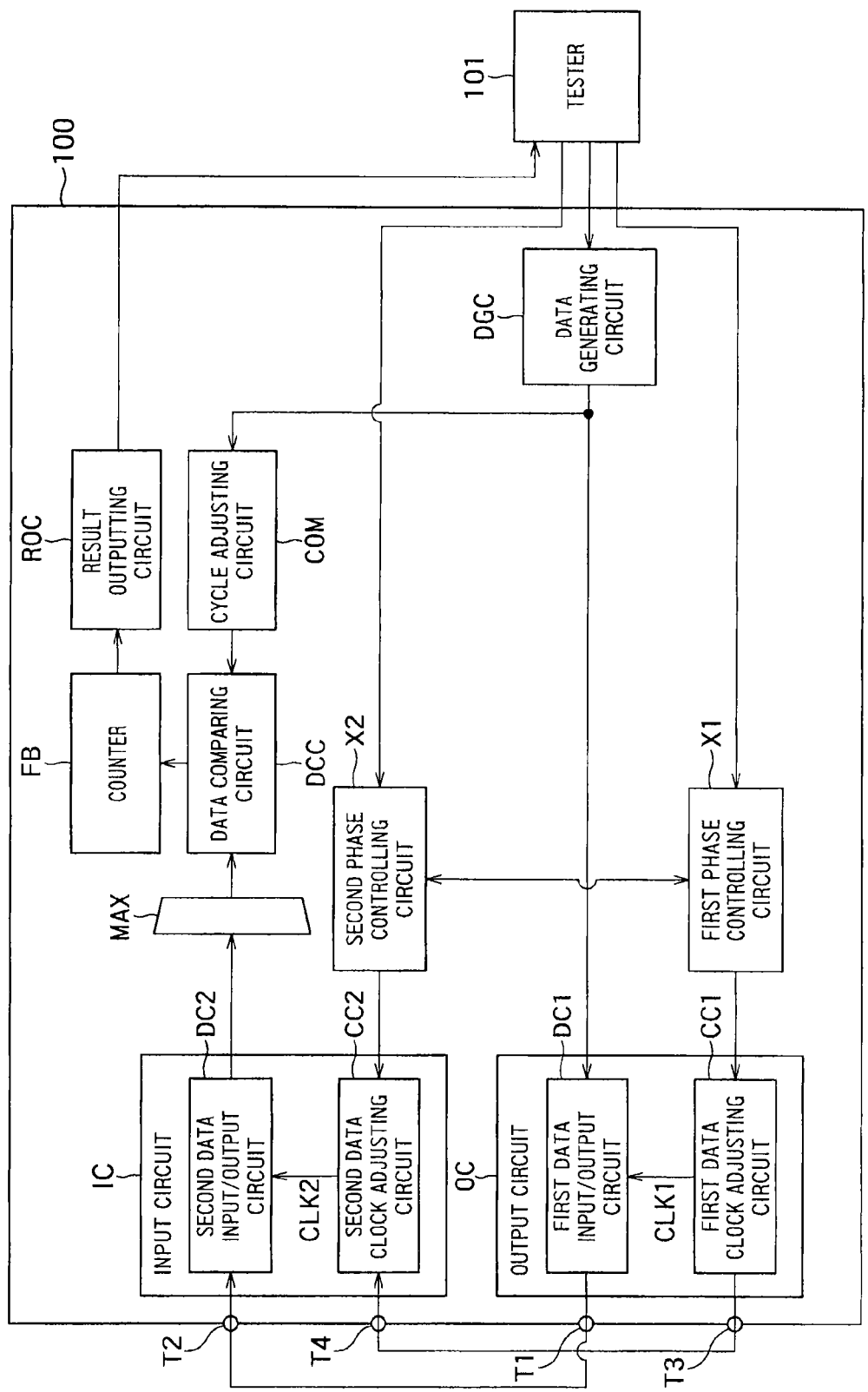
FIG. 1 is a circuit diagram showing an example of a configuration of a semiconductor integrated circuit 100 according to a first embodiment.

FIG. 1 is a circuit diagram showing an example of a configuration of a semiconductor integrated circuit 100 according to a first embodiment. Note that FIG. 1 shows an example of a state of the semiconductor integrated circuit 100 in a test operation.

Figure 2:
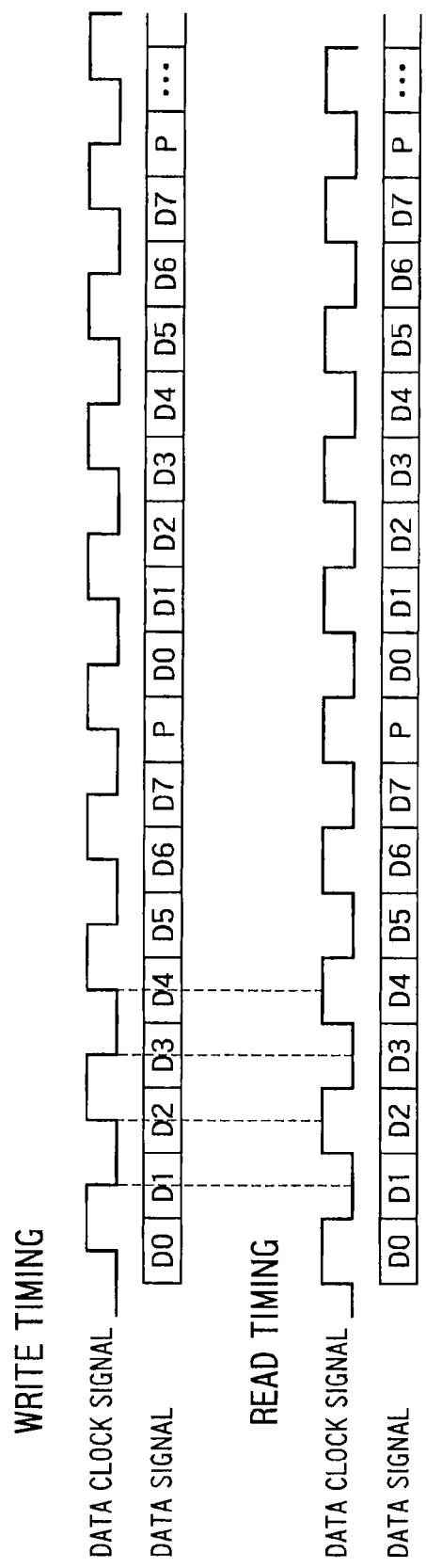
FIG. 2 is a waveform diagram showing an example of a read timing and a write timing of the semiconductor integrated circuit 100 shown in FIG. 1.

FIG. 2 is a waveform diagram showing an example of a read timing and a write timing of the semiconductor integrated circuit 100 shown in FIG. 1. Note that a data clock signal shown in FIG. 2 is ready for a DDR scheme, and a data signal contains a cycle of data "D0" to "D7" and parity data "P".

As shown in FIG. 1, the semiconductor integrated circuit 100 includes a first terminal "T1", a second terminal "T2", a third terminal "T3", a fourth terminal "T4", a first data clock adjusting circuit "CC1", a second data clock adjusting circuit "CC2", a first phase controlling circuit "X1", a second phase controlling circuit "X2", a first data input/output circuit "DC1", a second data input/output circuit "DC2", a data generating circuit "DGC", a cycle adjusting circuit "COM", a data comparing circuit "DCC", a counter "FB", a result outputting circuit "ROC" and a selecting circuit "MAX". In this embodiment, the second data input/output circuit "DC2" and the second data clock adjusting circuit "CC2" form an input circuit "IC", and the first data input/output circuit "DC1" and the first data clock adjusting circuit "CC1" form an output circuit "OC".

The first and second data input/output circuits "DC1" and "DC2" are any of circuits including an input/output circuit that receives and outputs data, an input circuit that only receives data, and an output circuit that only outputs data.

The second data clock adjusting circuit "CC2" is capable of outputting a second clock signal (data clock signal) "CLK2" at a predetermined timing and is connected to the fourth terminal "T4".

The first data clock adjusting circuit "CC1" is capable of outputting a first clock signal (data clock signal) "CLK1" at a predetermined timing and is connected to the third terminal "T3".

The second phase controlling circuit "X2" is configured to continuously controlling the phase of the second clock signal "CLK2" output from the second data clock adjusting circuit "CC2".

Note that, in the test operation, the second phase controlling circuit "X2" controls the phase amount of the second clock signal "CLK2" to be changed in response to an instruction output from a tester 101.

The first phase controlling circuit "X1" is capable of continuously controlling the phase of the first clock signal "CLK1" output from the first data clock adjusting circuit "CC1" and superposing a jitter on the first clock signal "CLK1".

Note that, in the test operation, the first phase controlling circuit "X1" controls the phase amount of the first clock signal "CLK1" to be changed and the jitter to be superposed in response to an instruction from the tester 101.

In addition, the second phase controlling circuit "X2" and the first phase controlling circuit "X1" are configured to operate in synchronization with each other.

The second data input/output circuit "DC2" is connected to the second terminal "T2" and is configured to strobe a data signal input thereto via the second terminal "T2" in synchronization with the second clock signal "CLK2" in the test operation.

The first data input/output circuit "DC1" is connected to the first terminal "T1" and is configured to output the data signal via the first terminal "T1" in synchronization with the first clock signal "CLK1" in a normal operation and in the test operation.

The selecting circuit "MAX" is configured to select and output any of a test data signal and a normal input data signal output from the second data input/output circuit "DC2".

The data generating circuit "DGC" is configured to generate an output data signal in the normal operation and generates the test data signal in the test operation. For example, the data generating circuit "DGC" generates a test data signal responsive to an instruction output from the tester 101 and inputs the test data signal to the first data input/output circuit "DC1" and the cycle adjusting circuit "COM" in the test operation.

The cycle adjusting circuit "COM" is capable of latching the test data signal generated by the data generating circuit "DGC" for each data cycle in the test operation and adjusting the timing of a data cycle in which the latched test data signal is output in order to compare data output from the second data input/output circuit "DC2" and data output from the data generating circuit "DGC" at the same time.

The data comparing circuit "DCC" is configured to compare data of the test data signal output from the cycle adjusting circuit "COM" and data of the test data signal strobed by the second data input/output circuit "DC2" and detect an error bit.

As described above, the cycle adjusting circuit "COM" adjusts the cycle in which the test data signal is output. This allows the data comparing circuit "DCC" to compare data "Dx" of the test data signal output from the cycle adjusting circuit "COM" and the data "Dx" of the test data signal strobed by the second input/output circuit "DC2" in synchronization with each other.

The counter "FB" is configured to count the number of error bits detected by the data comparing circuit "DCC".

The result outputting circuit "ROC" is configured to output an analysis result based on the number of the error bits counted by the counter "FB".

Next, an example of an operation of the semiconductor integrated circuit 100 configured as described above will be described.

First, an example of the test operation that assumes a case where a data clock signal at a write timing shown in FIG. 2 is input to the semiconductor integrated circuit 100 will be described.

In the test operation, first, the first terminal "T1" and the second terminal "T2" are connected to each other, and the third terminal "T3" and the fourth terminal "T4" are connected to each other (FIG. 1).

For example, in this test operation, the first terminal "T1" and the second terminal "T2" are short-circuited to each other on the outside of the semiconductor integrated circuit 100, and the third terminal "T3" and the fourth terminal "T4" are short-circuited to each other on the outside of the semiconductor integrated circuit 100.

In addition, in the test operation, a first load (a load corresponding to a load in actual use) may be connected between the first terminal "T1" and the second terminal "T2" on the outside of the semiconductor integrated circuit 100, and a second load (a load corresponding to a load in actual use) may be connected between the third terminal "T3" and the fourth terminal "T4" on the outside of the semiconductor integrated circuit 100. In that case, the first and second loads are coaxial cables, for example.

Then, the tester 101 outputs a predetermined instruction to the data generating circuit "DGC", the first phase controlling circuit "X1" and the second phase controlling circuit "X2".

In response to this, the first data clock adjusting circuit "CC1" inputs the first clock signal "CLK1" to the first data input/output circuit "DC1" and outputs, to the third terminal "T3", the first clock signal "CLK1" whose phase is shifted by a phase amount set by the first phase controlling circuit "X1". In this process, the first phase controlling circuit "X1" may superpose a jitter on the first clock signal "CLK1" to be output to the third terminal "T3" by the first data clock adjusting circuit "CC1".

In a case where the DDR scheme is applied to the semiconductor integrated circuit 100, for example, the phase amount set by the first phase controlling circuit "X1" is 90°. That is, the phase amount is the phase difference between the phase of the data clock signal at the write timing and the phase of the data clock signal at the read timing.

Then, under the control of the first clock signal "CLK1" input thereto from the first data clock adjusting circuit "CC1", the first data input/output circuit "DC1" outputs, to the first terminal "T1", the test data signal generated by the data generating circuit "DGC" with the phase of the write timing shown in FIG. 2.

Besides, the second data clock adjusting circuit "CC2" inputs the signal input thereto via the third terminal "T3" and the fourth terminal "T4" (outside path) to the second data input/output circuit "DC2" as the second clock signal "CLK2".

Then, the second data input/output circuit "DC2" strobes the test data signal input thereto via the first terminal "T1" and the second terminal "T2" (outside path) in synchronization with the second clock signal "CLK2" input thereto from the second data clock adjusting circuit "CC2".

That is, the input circuit "IC" (the second data clock adjusting circuit "CC2" and the second data input/output circuit "DC2") operates at the same timing as in the normal operation.

Meanwhile, the selecting circuit "MAX" selects the test data signal output from the second data input/output circuit "DC2" and outputs the test data signal to the data comparing circuit "DCC".

Then, the data comparing circuit "DCC" compares the data of the test data signal output from the cycle adjusting circuit "COM" and the data of the test data signal strobed by the second data input/output circuit "DC2" and detects an error bit.

Then, the counter "FB" counts the number of error bits detected by the data comparing circuit "DCC".

Then, the result outputting circuit "ROC" outputs an analysis result based on the number of the error bits counted by the counter "FB".

Then, the tester 101 evaluates a transmission margin based on the analysis result.

In the test operation described above, which involves once putting a signal on the outside of the semiconductor integrated circuit 100, a load can be imposed on the outside path. Thus, a test that simulates an actual condition including a substrate capacitance can be conducted.

In addition, an arbitrary jitter (a slow change or an abrupt change) can be superposed on the data clock signal, a digital error rate in writing caused by the jitter can be observed for an individual sample in an environment that simulates an actual condition.

Next, an example of the test operation that assumes a case where a data clock signal at a read timing shown in FIG. 2 is output from the semiconductor integrated circuit 100 will be described.

In the test operation, first, the first terminal "T1" and the second terminal "T2" are connected to each other, and the third terminal "T3" and the fourth terminal "T4" are connected to each other (FIG. 1).

As described above, in this test operation, the first terminal "T1" and the second terminal "T2" are short-circuited to each other on the outside of the semiconductor integrated circuit 100, and the third terminal "T3" and the fourth terminal "T4" are short-circuited to each other on the outside of the semiconductor integrated circuit 100.

In addition, as described above, in the test operation, a first load (a load corresponding to a load in actual use) may be connected between the first terminal "T1" and the second terminal "T2" on the outside of the semiconductor integrated circuit 100, and a second load (a load corresponding to a load in actual use) may be connected between the third terminal "T3" and the fourth terminal "T4" on the outside of the semiconductor integrated circuit 100.

Then, the tester 101 outputs a predetermined instruction to the data generating circuit "DGC", the first phase controlling circuit "X1" and the second phase controlling circuit "X2".

In response to this, the first data clock adjusting circuit "CC1" inputs the first clock signal "CLK1" to the first data input/output circuit "DC1" and outputs the first clock signal "CLK1" to the third terminal "T3".

Then, the first data input/output circuit "DC1" outputs the test data signal generated by the data generating circuit "DGC" to the first terminal "T1" in synchronization with the first clock signal "CLK1" input thereto from the first data clock adjusting circuit "CC1".

Then, the second data clock adjusting circuit "CC2" inputs, to the second data input/output circuit "DC2" as the second clock signal "CLK2", the first clock signal "CLK1" input via the third terminal "T3" and the fourth terminal "T4" (outside path) whose phase is shifted by a phase amount set by the second phase controlling circuit "X2".

In a case where the DDR scheme is applied to the semiconductor integrated circuit 100, for example, the phase amount set by the second phase controlling circuit "X2" is 90°. That is, the phase amount is the phase difference between the phase of the data clock signal at the write timing and the phase of the data clock signal at the read timing.

Then, the second data input/output circuit "DC2" strobes the test data signal input thereto via the first terminal "T1" and the second terminal "T2" (outside path) in synchronization with the second clock signal "CLK2" input thereto from the second data clock adjusting circuit "CC2".

Meanwhile, the selecting circuit "MAX" selects the test data signal output from the second data input/output circuit "DC2" and outputs the test data signal to the data comparing circuit "DCC".

Then, the data comparing circuit "DCC" compares the data of the test data signal output from the cycle adjusting circuit "COM" and the data of the test data signal strobed by the second data input/output circuit "DC2" and detects an error bit.

Then, the counter "FB" counts the number of error bits detected by the data comparing circuit "DCC".

Then, the result outputting circuit "ROC" outputs an analysis result based on the number of the error bits counted by the counter "FB".

Then, the tester 101 evaluates a reception margin based on the analysis result.

In the test operation described above, which involves once putting a signal on the outside of the semiconductor integrated circuit 100, a load can be imposed on the outside path. Thus, a test that simulates an actual condition including a substrate capacitance can be conducted.

In the test operation, the first phase controlling circuit "X1" makes the output circuit "OUT" (the first data input/output circuit "DC1" and the first data clock adjusting circuit "CC1") output the data clock signal in phase with the data signal to the first and third terminals "T1" and "T3". Provided that the phase of the first clock signal "CLK1" at this time is referred to as a first phase, the phase of the first clock signal "CLK1" output from the first data clock adjusting circuit "CC1" is increased from the first phase, and the phase difference between the first phase and a second phase, which is the phase of the first clock signal at the time when the first pass determination occurs, is calculated. As a result, the phase shift between on silicon and on the test board can be precisely measured.

For example, if the tester 101 measures the phase shift, the phase shift due to a parasitic capacitance caused by the test board or the tester, which is an outside path load, is made obvious. Thus, the phase shift can be cancelled, and a bit error rate (BER) test can be stably conducted with the tester 101.

As described above, in a system in which the phases of the data clock signal and the data signal differ between at the input and at the output, the semiconductor integrated circuit according to this first embodiment can perform a simple BER test without using external equipment and, at the same time, can perform a jitter evaluation required for a margin evaluation.

In the above first embodiment, an example in which the present invention is applied to a semiconductor integrated circuit having a 2-ch communication port on the DDR scheme has been described. However, the present invention can be equally applied to a semiconductor integrated circuit having a 3- or more-ch communication port.

Second Embodiment

In a second embodiment, an example in which the present invention is applied to a semiconductor integrated circuit having a 1-ch communication port on the DDR scheme will be described.

Figure 3:
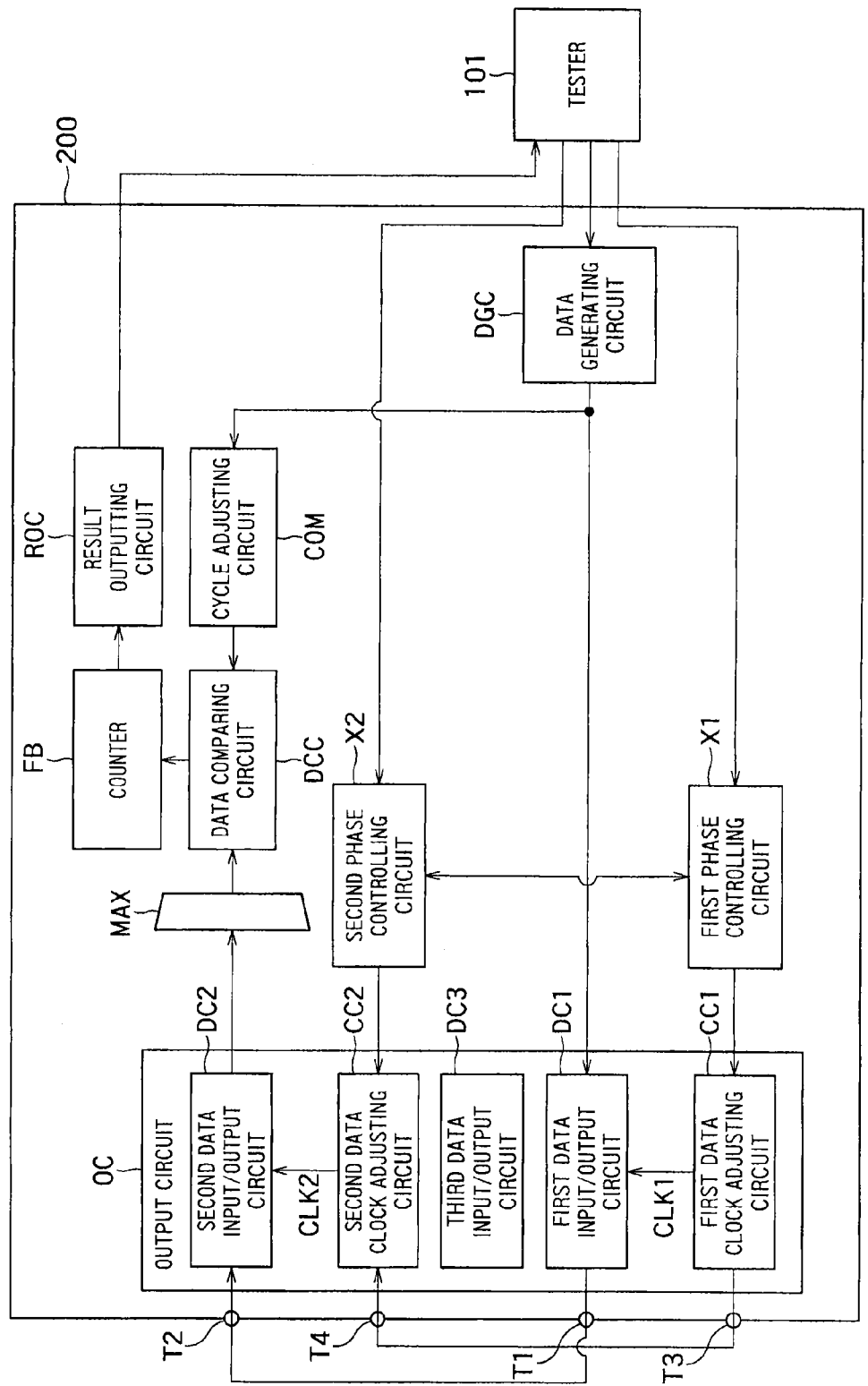
FIG. 3 is a circuit diagram showing an example of a configuration of a semiconductor integrated circuit 200 according to the second embodiment.
Figure 4:
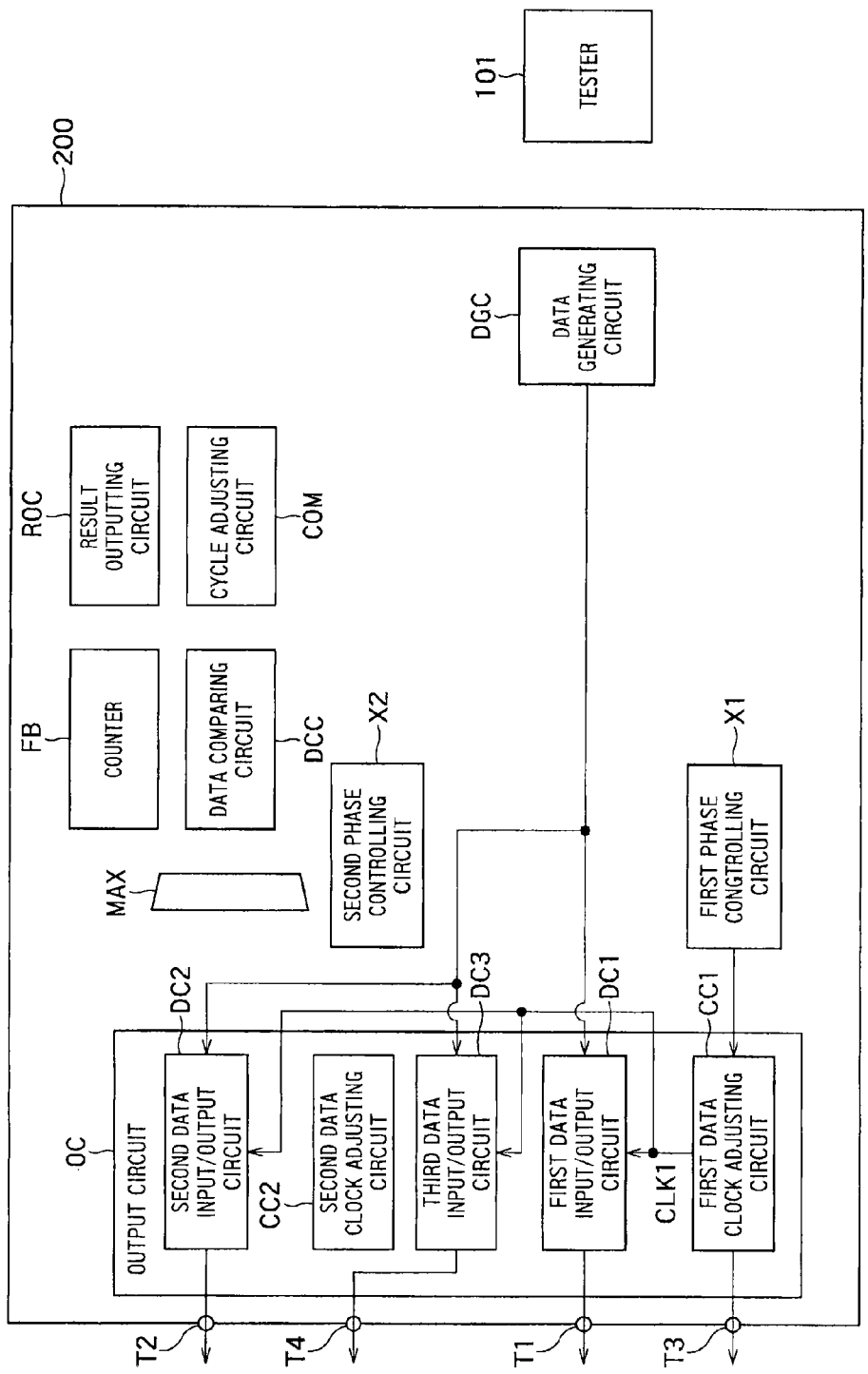
FIG. 4 is a diagram showing an example of an outputting state of the semiconductor integrated circuit 200 shown in FIG. 3 in the normal operation.

FIG. 3 is a circuit diagram showing an example of a configuration of a semiconductor integrated circuit 200 according to the second embodiment. FIG. 4 is a diagram showing an example of an outputting state of the semiconductor integrated circuit 200 shown in FIG. 3 in the normal operation. Note that FIG. 3 shows an example of a state of the semiconductor integrated circuit 200 in the test operation. In FIGS. 3 and 4, the same reference symbols as those in FIG. 1 denote the same components as those in the first embodiment.

As shown in FIG. 3, the semiconductor integrated circuit 200 includes the first terminal "T1", the second terminal "T2", the third terminal "T3", the fourth terminal "T4", the first data clock adjusting circuit "CC1", the second data clock adjusting circuit "CC2", the first phase controlling circuit "X1", the second phase controlling circuit "X2", the first data input/output circuit "DC1", the second data input/output circuit "DC2", a third data input/output circuit "DC3", the data generating circuit "DGC", the cycle adjusting circuit "COM", the data comparing circuit "DCC", the counter "FB", the result outputting circuit "ROC" and the selecting circuit "MAX".

That is, compared with the semiconductor integrated circuit 100 according to the first embodiment, the semiconductor integrated circuit 200 further includes the third data input/output circuit "DC3".

The third data input/output circuit "DC3" is connected to the fourth terminal "T4" and is configured to output a data signal via the fourth terminal "T4" in synchronization with the first clock signal "CLK1" in the normal operation shown in FIG. 4, as with the first and second data input/output circuits "DC1" and "DC2".

In this embodiment, the first data input/output circuit "DC1", the first data clock adjusting circuit "CC1", the second data input/output circuit "DC2", the second data clock adjusting circuit "CC2" and the third data input/output circuit "DC3" form an output circuit "OC".

The first to third data input/output circuits "DC1" to "DC3" are any of circuits including an input/output circuit that receives and outputs data, an input circuit that only receives data, and an output circuit that only outputs data.

The remainder of the configuration of the semiconductor integrated circuit 200 is the same as that of the semiconductor integrated circuit 100 according to the first embodiment.

Next, an example of an operation of the semiconductor integrated circuit 200 configured as described above will be described.

In the test operation, first, the first terminal "T1" and the second terminal "T2" are connected to each other, and the third terminal "T3" and the fourth terminal "T4" are connected to each other (FIG. 3).

As described above, in this test operation, the first terminal "T1" and the second terminal "T2" are short-circuited to each other on the outside of the semiconductor integrated circuit 200, and the third terminal "T3" and the fourth terminal "T4" are short-circuited to each other on the outside of the semiconductor integrated circuit 200.

In addition, as described above, in the test operation, a first load (a load corresponding to a load in actual use) may be connected between the first terminal "T1" and the second terminal "T2" on the outside of the semiconductor integrated circuit 200, and a second load (a load corresponding to a load in actual use) may be connected between the third terminal "T3" and the fourth terminal "T4" on the outside of the semiconductor integrated circuit 200.

Then, the tester 101 outputs a predetermined instruction to the data generating circuit "DGC", the first phase controlling circuit "X1" and the second phase controlling circuit "X2".

In response to this, the first data clock adjusting circuit "CC1" inputs the first clock signal "CLK1" to the first data input/output circuit "DC1" and outputs the first clock signal "CLK1" to the third terminal "T3". In this process, the first phase controlling circuit "X1" may superpose a jitter on the first clock signal "CLK1" to be output to the third terminal "T3" by the first data clock adjusting circuit "CC1".

Then, the first data input/output circuit "DC1" outputs the test data signal generated by the data generating circuit "DGC" to the first terminal "T1" in synchronization with the first clock signal "CLK1" input thereto from the first data clock adjusting circuit "CC1".

Besides, the second data clock adjusting circuit "CC2" inputs, to the second data input/output circuit "DC2" as the second clock signal "CLK2", the first clock signal "CLK1" input thereto via the third terminal "T3" and the fourth terminal "T4" (outside path) whose phase is shifted by a phase amount set by the second phase controlling circuit "X2".

In a case where the DDR scheme is applied to the semiconductor integrated circuit 200, for example, the phase amount set by the second phase controlling circuit "X2" is 90°. That is, the phase amount is the phase difference between the phase of the data clock signal at the write timing and the phase of the data clock signal at the read timing.

Then, the second data input/output circuit "DC2" strobes the test data signal input thereto via the first terminal "T1" and the second terminal "T2" (outside path) in synchronization with the second clock signal "CLK2" input thereto from the second data clock adjusting circuit "CC2".

Meanwhile, the selecting circuit "MAX" selects the test data signal output from the second data input/output circuit "DC2" and outputs the test data signal to the data comparing circuit "DCC".

Then, the data comparing circuit "DCC" compares the data of the test data signal output from the cycle adjusting circuit "COM" and the data of the test data signal strobed by the second data input/output circuit "DC2" and detects an error bit.

Then, the counter "FB" counts the number of error bits detected by the data comparing circuit "DCC".

Then, the result outputting circuit "ROC" outputs an analysis result based on the number of the error bits counted by the counter "FB".

Then, the tester 101 evaluates a communication margin based on the analysis result.

In the test operation described above, which involves once putting a signal on the outside of the semiconductor integrated circuit 200, a load can be imposed on the outside path. Thus, a test that simulates an actual condition including a substrate capacitance can be conducted.

In addition, an arbitrary jitter (a slow change or an abrupt change) can be superposed on the data clock signal, and a digital error rate in reading caused by the jitter can be observed for an individual sample.

Next, an example of the normal operation of the semiconductor integrated circuit 200 will be briefly described.

As shown in FIG. 4, in the normal output operation, the data generating circuit "DGC" generates an output data signal and inputs the output data signal to the first to third data input/output circuits "DC1" to "DC3".

Then, the first data input/output circuit "DC1" outputs the data signal via the first terminal "T1" in synchronization with the first clock signal "CLK1".

In addition, the second data input/output circuit "DC2" outputs the data signal via the second terminal "T2" in synchronization with the first clock signal "CLK1".

In addition, the third data input/output circuit "DC3" outputs the data signal via the third terminal "T3" in synchronization with the first clock signal "CLK1".

In the normal output operation, the semiconductor integrated circuit 200 outputs a predetermined data signal from the 1-ch communication port (output circuit "OC") in this manner (FIG. 4).

The remainder of the operation of the semiconductor integrated circuit 200 is the same as that of the semiconductor integrated circuit 100 according to the first embodiment.

That is, in a system in which the phases of the data clock signal and the data signal differ between at the input and at the output, the semiconductor integrated circuit 200 according to this second embodiment can perform a simple BER test without using external equipment and, at the same time, can perform a jitter evaluation required for a margin evaluation.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor integrated circuit having a first terminal, a second terminal, a third terminal and a fourth terminal, the semiconductor integrated circuit comprises:
    a first data clock adjusting circuit that outputs a first clock signal to an outside of the semiconductor integrated circuit via the first terminal;
    a first phase controlling circuit that is capable of controlling a phase of the first clock signal output from the first data clock adjusting circuit and superposing a jitter on the first clock signal;
    a second data clock adjusting circuit that receives the first clock signal from the outside of the semiconductor integrated circuit via the second terminal and outputs a second clock signal;
    a second phase controlling circuit that controls a phase of the second clock signal output from the second data clock adjusting circuit;
    a data generating circuit that generates a test data signal in a test operation;
    a first data input/output circuit that outputs the test data signal to the outside of the semiconductor integrated circuit via the third terminal in synchronization with the first clock signal in the test operation;
    a second data input/output circuit that strobes the test data signal input thereto from the outside of the semiconductor integrated circuit via the fourth terminal in synchronization with the second clock signal in the test operation;
    a cycle adjusting circuit that is capable of, in the test operation, latching the test data signal generated by the data generating circuit and adjusting a cycle in which the latched test data signal is output;
    a data comparing circuit that compares data of the test data signal output from the cycle adjusting circuit and data of the test data signal strobed by the second data input/output circuit and detects an error bit;
    a counter that counts the number of error bits detected by the data comparing circuit; and
    a result outputting circuit that outputs an analysis result based on the number of the error bits counted by the counter.

2. The semiconductor integrated circuit according to claim 1, wherein, in the test operation,
    the second terminal and the first terminal are connected to each other, the fourth terminal and the third terminal are connected to each other,
    the first data clock adjusting circuit inputs the first clock signal to the first data input/output circuit and outputs, to the third terminal, the first clock signal whose phase is shifted by a phase amount set by the first phase controlling circuit,
    the first data input/output circuit outputs the test data signal generated by the data generating circuit to the first terminal in synchronization with the first clock signal input thereto from the first data clock adjusting circuit,
    the second data clock adjusting circuit inputs the signal input thereto via the third terminal and the fourth terminal to the second data input/output circuit as the second clock signal,
    the second data input/output circuit strobes the test data signal input thereto via the first terminal and the second terminal in synchronization with the second clock signal input thereto from the second data clock adjusting circuit,
    the data comparing circuit compares data of the test data signal output from the cycle adjusting circuit and data of the test data signal strobed by the second data input/output circuit and detects an error bit,
    the counter counts the number of error bits detected by the data comparing circuit, and
    the result outputting circuit outputs an analysis result based on the number of the error bits counted by the counter.

3. The semiconductor integrated circuit according to claim 1, wherein, in that in the test operation,
    the second terminal and the first terminal are connected to each other, the fourth terminal and the third terminal are connected to each other,
    the first data clock adjusting circuit inputs the first clock signal to the first data input/output circuit and outputs the first clock signal to the third terminal,
    the first data input/output circuit outputs the test data signal generated by the data generating circuit to the first terminal in synchronization with the first clock signal input thereto from the first data clock adjusting circuit, and
    the second data clock adjusting circuit supplies, to the second data input/output circuit as the second clock signal, the first clock signal input thereto via the third terminal and the fourth terminal whose phase is shifted by a phase amount set by the second phase controlling circuit,
    the second data input/output circuit strobes the test data signal input thereto via the first terminal and the second terminal in synchronization with the second clock signal input thereto from the second data clock adjusting circuit,
    the data comparing circuit compares data of the test data signal output from the cycle adjusting circuit and data of the test data signal strobed by the second data input/output circuit and detects an error bit,
    the counter counts the number of error bits detected by the data comparing circuit, and
    the result outputting circuit outputs an analysis result based on the number of the error bits counted by the counter.

4. The semiconductor integrated circuit according to claim 2, wherein, in the test operation,
    the first phase controlling circuit superposes a jitter on the first clock signal output to the third terminal by the first data clock adjusting circuit.

5. The semiconductor integrated circuit according to claim 3, wherein, in the test operation,
    the first phase controlling circuit superposes a jitter on the first clock signal output to the third terminal by the first data clock adjusting circuit.

6. The semiconductor integrated circuit according to claim 2, wherein, in the test operation, the second terminal and the first terminal are short-circuited to each other on the outside of the semiconductor integrated circuit, and the fourth terminal and the third terminal are short-circuited to each other on the outside of the semiconductor integrated circuit.

7. The semiconductor integrated circuit according to claim 3, wherein, in the test operation, the second terminal and the first terminal are short-circuited to each other on the outside of the semiconductor integrated circuit, and the fourth terminal and the third terminal are short-circuited to each other on the outside of the semiconductor integrated circuit.

8. The semiconductor integrated circuit according to claim 2, wherein, in the test operation, a second load is connected between the second terminal and the first terminal on the outside of the semiconductor integrated circuit, and a first load is connected between the fourth terminal and the third terminal on the outside of the semiconductor integrated circuit.

9. The semiconductor integrated circuit according to claim 3, wherein, in the test operation, a second load is connected between the second terminal and the first terminal on the outside of the semiconductor integrated circuit, and a first load is connected between the fourth terminal and the third terminal on the outside of the semiconductor integrated circuit.

10. The semiconductor integrated circuit according to claim 8, wherein the second and first loads are coaxial cables.

11. The semiconductor integrated circuit according to claim 9, characterized in that in the second and first loads are coaxial cables.

12. The semiconductor integrated circuit according to claim 2, wherein, in a case where a DDR scheme is applied to the semiconductor integrated circuit, the phase amount set by the first phase controlling circuit is 90°.

13. The semiconductor integrated circuit according to claim 3, wherein, in a case where a DDR scheme is applied to the semiconductor integrated circuit, the phase amount set by the first phase controlling circuit is 90°.

14. The semiconductor integrated circuit according to claim 1, further comprises:

a third data input/output circuit that is connected to the fourth terminal and outputs a data signal via the fourth terminal in synchronization with the first clock signal in an normal operation.

15. The semiconductor integrated circuit according to claim 14, wherein, in the normal operation, the data generating circuit generates an output data signal and inputs the output data signal to the third data input/output circuit, the first data input/output circuit outputs a data signal via the first terminal in synchronization with the first clock signal, the second input/output circuit outputs a data signal via the second terminal in synchronization with the first clock signal, and the third data input/output circuit outputs a data signal via the fourth terminal in synchronization with the first clock signal.

16. The semiconductor integrated circuit according to claim 15, wherein, in the test operation, the second terminal and the first terminal are connected to each other, the fourth terminal and the third terminal are connected to each other, the first data clock adjusting circuit inputs the first clock signal to the first data input/output circuit and outputs the first clock signal to the third terminal, the first data input/output circuit outputs the test data signal generated by the data generating circuit to the first terminal in synchronization with the first clock signal input thereto from the first data clock adjusting circuit, the second data clock adjusting circuit inputs, to the second data input/output circuit as the second clock signal, the first clock signal input thereto via the third terminal and the fourth terminal whose phase is shifted by a phase amount set by the second phase controlling circuit, the second data input/output circuit strobes the test data signal input thereto via the first terminal and the second terminal in synchronization with the second clock signal input thereto from the second data clock adjusting circuit, the data comparing circuit compares data of the test data signal output from the cycle adjusting circuit and data of the test data signal strobed by the second data input/output circuit and detects an error bit, the counter counts the number of error bits detected by the data comparing circuit, and the result outputting circuit outputs an analysis result based on the number of the error bits counted by the counter.

* * * * *